(12) United States Patent
Rubin et al.

(10) Patent No.: US 10,483,344 B1
(45) Date of Patent: Nov. 19, 2019

(54) FABRICATION OF A MIM CAPACITOR STRUCTURE WITH VIA ETCH CONTROL WITH INTEGRATED MASKLESS ETCH TUNING LAYERS

(71) Applicant: INTERNATIONAL BUSINESS MACHINES CORPORATION, Armonk, NY (US)

(72) Inventors: Joshua M. Rubin, Albany, NY (US); Son Nguyen, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/963,406

(22) Filed: Apr. 26, 2018

(51) Int. Cl.
*H01L 49/02* (2006.01)
*H01L 21/768* (2006.01)

(52) U.S. Cl.
CPC ........ *H01L 28/40* (2013.01); *H01L 21/76877* (2013.01)

(58) Field of Classification Search
None
See application file for complete search history.

(56) References Cited

U.S. PATENT DOCUMENTS

| | | |
|---|---|---|
| 6,430,028 B1 | 8/2002 | Kar-Roy et al. |
| 7,985,645 B2 | 7/2011 | Park et al. |
| 8,610,248 B2 | 12/2013 | Liang et al. |
| 8,878,338 B2 * | 11/2014 | Chang ............... H01L 28/60 257/532 |
| 8,987,133 B2 | 3/2015 | Nguyen et al. |
| 9,263,551 B2 | 2/2016 | Liu et al. |
| 9,391,016 B2 | 7/2016 | Shen et al. |
| 9,424,992 B2 * | 8/2016 | Dunn ............... H01G 4/1209 |
| 9,466,661 B2 | 10/2016 | Triyoso et al. |
| 9,627,312 B2 | 4/2017 | Childs et al. |
| 9,761,655 B1 | 9/2017 | Ando et al. |
| 2006/0205143 A1 | 9/2006 | Govindarajan |
| 2015/0187864 A1 * | 7/2015 | Chang ............... H01L 28/60 257/532 |
| 2016/0035817 A1 * | 2/2016 | Hsu ............... H01L 28/60 257/532 |

OTHER PUBLICATIONS

M. Eizenberg et al., TiCN: A new chemical vapor deposited contact barrier metallization for submicron devices American Institute of Physics Nov. 7, 1994 pp. 2416-2418 vol. 65 No. 19.

* cited by examiner

*Primary Examiner* — Ali Naraghi
(74) *Attorney, Agent, or Firm* — Tutunjian & Bitetto, P.C.; Vazken Alexanian

(57) ABSTRACT

A semiconductor device includes a base structure including contacts and a first interlevel dielectric (ILD) layer, a metal-insulator metal (MIM) capacitor structure on the base structure, a second ILD layer on the MIM capacitor structure, and a plurality of vias including a first via on a first one of the contacts and penetrating through the first and second ILD layers, first and third etch tuning layers of the MIM capacitor structure and a second plate of the MIM capacitor structure, and a second via on a second one of the contacts and penetrating through the first and second ILD layers, a second etch tuning layer of the MIM capacitor structure, and first and third plates of the MIM capacitor structure.

18 Claims, 11 Drawing Sheets

FABRICATION OF A MIM CAPACITOR STRUCTURE WITH VIA ETCH CONTROL WITH INTEGRATED MASKLESS ETCH TUNING LAYERS

BACKGROUND

Technical Field

The present invention generally relates to semiconductor devices, and more particularly to metal-insulator-metal (MIM) capacitors and methods of forming thereof.

Description of the Related Art

A metal-insulator-metal (MIM) capacitor is a structure that includes electrically conductive material layers or plates separated and insulated from each other by an insulator material (e.g., dielectric layer) for storing a charge. MIM capacitors can be used for power noise mitigation (e.g., as a decoupling capacitor), voltage regulation, radio frequency (RF) circuits, etc.

SUMMARY

In accordance an embodiment of the present invention, a method for fabricating a semiconductor device is provided. The method includes forming a first plate of a metal-insulator-metal (MIM) capacitor structure and a first etch tuning layer adjacent to the first plate on a base structure. The base structure includes contacts formed within a base layer. The method further includes forming a first dielectric layer on the first plate and the first etch tuning layer, forming a second plate of the MIM capacitor structure and a second etch tuning layer adjacent to the second plate on the first dielectric layer, forming a second dielectric layer on the second plate and the second etch tuning layer, and forming a third plate of the MIM capacitor structure and a third etch tuning layer adjacent to the third plate on the second dielectric layer. The etch tuning layer include materials for balancing etch depth during formation of a plurality of vias.

In accordance with another embodiment of the present invention, a method for fabricating a semiconductor device is provided. The method includes forming a first plate of a metal-insulator-metal (MIM) capacitor structure on a base structure. The base structure includes contacts formed within a base layer. The method further includes forming a first sacrificial layer on the first plate, forming a first etch tuning layer on the base structure adjacent to the first plate and the first sacrificial layer, removing the first sacrificial layer, and forming a first dielectric layer on the first etch tuning layer and the first plate, forming a second plate of the MIM capacitor structure on the first dielectric layer, and a second sacrificial layer on the second plate, forming a second etch tuning layer on the second sacrificial layer and the first dielectric layer, and planarizing such that the second etch tuning layer has a surface co-linear with surfaces of the second plate and the second sacrificial layer, removing the second sacrificial layer, and forming a second dielectric layer on the second etch tuning layer and the second plate, and forming a third plate of the MIM capacitor structure and a third etch tuning layer adjacent to the third plate on the third dielectric layer. The etch tuning layers include materials for balancing etch depth during formation of vias.

In accordance with yet another embodiment of the present invention a semiconductor device is provided. The device includes a base structure including contacts and a first interlevel dielectric (ILD) layer, and a metal-insulator metal (MIM) capacitor structure on the base structure. The MIM capacitor structure includes a first plate adjacent to a first etch tuning layer on the ILD layer, a first dielectric layer on the first plate and the first etch tuning layer, a second plate adjacent to a second etch tuning layer on the first dielectric layer, a second dielectric layer on the second plate and the second etch tuning layer, and a third plate adjacent to a third etch tuning layer on the second dielectric layer a second ILD layer on the MIM capacitor structure. The device further includes a plurality of vias including a first via and a second via. The first via is on a first one of the contacts and penetrating through the first and second ILD layers, the first and third etch tuning layers and the second plate. The second via is on a second one of the contacts and penetrating through the first and second ILD layers, the second etch tuning layer and the first and third plates.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
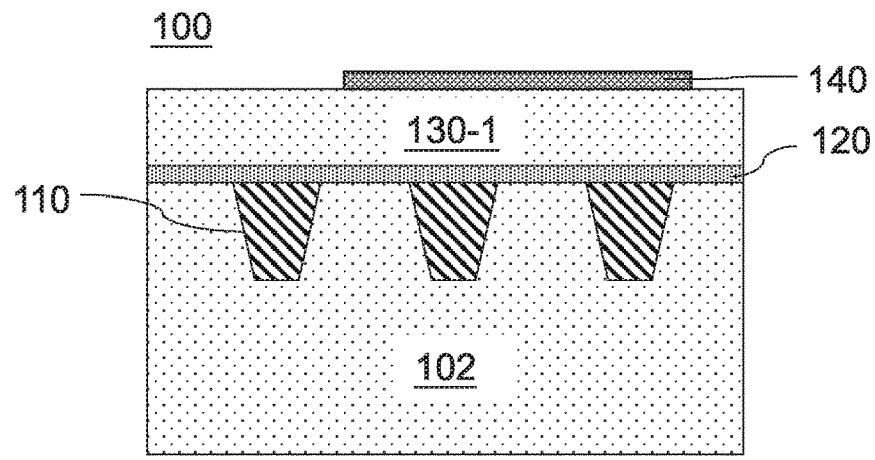
FIG. 1 is a cross-sectional view a bottom plate formed during the fabrication of a first semiconductor device including a MIM capacitor structure, in accordance with an embodiment of the present invention.

A metal-insulator-metal (MIM) capacitor structure can include a MIM capacitor in which vias land on MIM plates and/or a MIM capacitor in which vias penetrate through the MIM plates with sidewall contact. A MIM capacitor in which vias penetrate through the MIM plates to form a contact to the MIM plates and metal layers above and below the MIM capacitor can be difficult to etch. Via etches can see 0, 1, 2, or even more plates (e.g., TiN plates) during the etch. Additionally, via etches have additional complexity stemming from having to etch a stack including plates, dielectrics (e.g., high-k dielectrics) and interlayer dielectrics (ILDs). This non-uniformity in the stack may need considerable overetch, and thus can damage underlying layers.

The embodiments described herein provide for a MIM capacitor structure that co-integrates select dielectric layers adjacent to the MIM plates to tune the etch properties of regions without the MIM plates. By using material layers that are more/less resistive to etch during MIM plate etch, uniformity can be achieved for via etches in regions of any number of MIM plates. Thus, the embodiments described herein can be used to balance etch rates while vias are etched through the MIM plates. In some embodiments, a conductive film (e.g., titanium carbonitride (TiCN) or the like) can be embedded in a MIM plate with substantially higher etch resistance as compared to, e.g., TiN or the like, for the purpose of balancing the via etch.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $SixGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements, FIGS. 1-8 depict respective steps of a process flow for fabricating a semiconductor device including a metal-insulator-metal (MIM) capacitor structure 100.

Referring to FIG. 1, a cross-sectional view showing the formation of a bottom plate of a semiconductor device 100 including a MIM capacitor structure is provided. As shown, the device 100 includes a base 102 having contacts 110 formed therein. The base 102 can include any suitable material in accordance with the embodiments described herein. For example, the base 102 can include a dielectric material. The contacts 110 can include any suitable material in accordance with the embodiment described herein. For example, the contacts 110 can include copper (Cu), or other suitable conductive material(s). Further, the contacts 110 can include a metal line or pad, which can be single or dual damascene.

The device 100 further includes a cap layer 120 formed on the base layer 102 and the contacts 110. The cap layer 120 can include any suitable material in accordance with the embodiments described herein. For example, the cap layer 120 can include a dielectric material.

The device 100 further includes an interlevel dielectric (ILD) layer 130-1. The ILD layer 130-1 can include any suitable material in accordance with the embodiments described herein. For example, the ILD layer 130-1 can include a low-dielectric material. A low-k dielectric material is a dielectric material having a dielectric constant (k) lower than the dielectric constant of silicon dioxide ($SiO_2$) at room temperature (e.g., around 20° C.-25° C.) and atmospheric pressure (e.g., around 1 atm). Examples of low-k dielectric materials include, e.g., organosilicate glass (OSG), fluorine doped silicon dioxide, carbon doped silicon dioxide, porous silicon dioxide, porous carbon doped silicon dioxide, spin-on organic polymeric dielectrics (e.g., SiLK™), spin-on silicone based polymeric dielectric (e.g., hydrogen silsesquioxane (HSQ) and methylsilsesquioxane (MSQ)), and combinations thereof.

The device 100 further includes bottom plate 140. The bottom plate 140 can be formed by depositing a blanket layer of bottom plate material, and patterning the bottom plate material. In one embodiment, the bottom plate material includes titanium nitride (TiN), although any suitable material can be used in accordance with the embodiments described herein. Any suitable patterning process can be used to pattern the bottom plate 140 in accordance with the embodiments described herein.

In an alternative embodiment, an etch stop layer can be formed on the ILD layer prior to the formation of the bottom plate 140. Further details regarding the etch stop layer will be described below with reference to FIG. 23.

Figure 2:
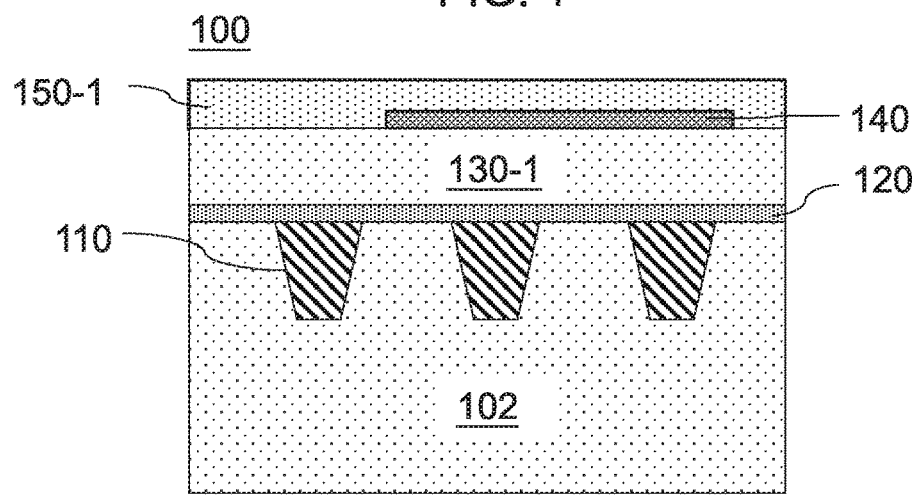
FIG. 2 is a cross-sectional view of layers of an etch tuning layer formed during the fabrication of the first semiconductor device, in accordance with an embodiment of the present invention.

Referring to FIG. 2, an etch tuning layer 150-1 is formed. The etch tuning layer 150-1 can include any suitable dielectric material having an etch rate similar to that of the bottom plate 140. For example, the etch tuning layer 150-1 can include a titanium oxynitride ($TiO_xN_y$), a tantalum oxide (e.g., $TaO_2$), etc. The etch tuning layer 150-1 can be formed using any suitable process in accordance with the embodiments described herein. For example, the etch tuning layer 150-1 can be formed by employing a chemical vapor deposition (CVD) process. In one embodiment, the etch tuning layer 150-1 can be formed by employing a plasma-enhanced CVD (PE-CVD) process. One example of a suitable PE-CVD process is a high density plasma CVD (HDP-CVD) process. For example, the dielectric material of the etch tuning layer 150-1 can include a material formed by employing a tetraethyl orthosilicate (TEOS) precursor (e.g., $SiO_2$).

Figure 3:
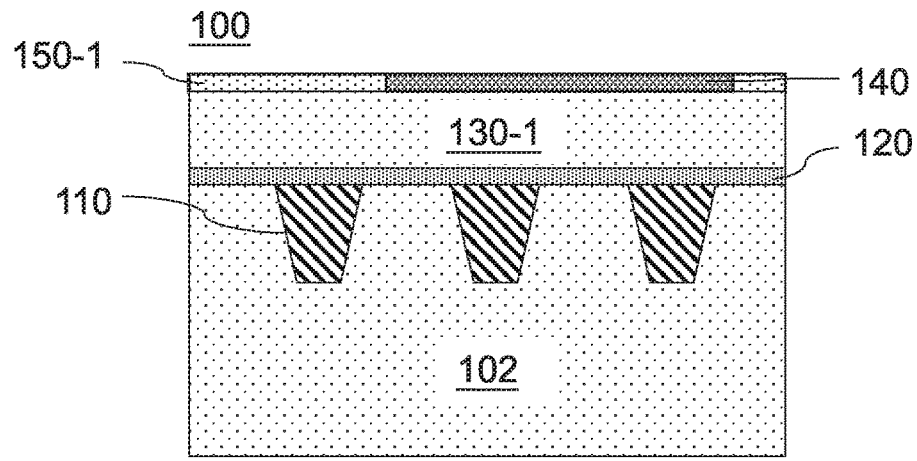
FIG. 3 is a cross-sectional view of planarization of the etch tuning layer during the fabrication of the first semiconductor device, in accordance with an embodiment of the present invention.

Referring to FIG. 3, the etch tuning layer 150-1 is planarized so that its surface is substantially co-linear with the surface of the bottom plate 140. In one embodiment, the etch tuning layer 150-1 is planarized by employing a chemical mechanical planarization (CMP) process. However, any suitable process for planarizing the etch tuning layer 150-1 can be used in accordance with the embodiments described herein.

Figure 4:
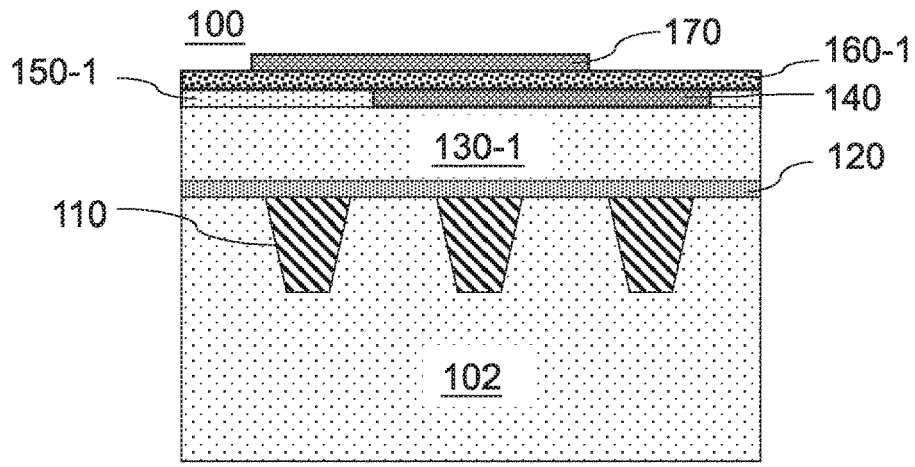
FIG. 4 is a cross-sectional view of a dielectric layer and a middle plate formed during the fabrication of the first semiconductor device, in accordance with an embodiment of the present invention.

Referring to FIG. 4, a dielectric layer 160-1 is formed on the bottom plate 140 and the etch tuning layer 150-1. The dielectric layer 160-1 can include any suitable material in accordance with the embodiments described herein. In one embodiment, the dielectric layer 160-1 includes a high-k dielectric material. A high-k dielectric material is a dielectric material having a dielectric constant (k) higher than the dielectric constant of silicon dioxide ($SiO_2$) at room temperature (e.g., around 20° C.-25° C.) and atmospheric pressure (e.g., around 1 atm). Examples of high-k dielectric materials include, but are not limited to, hafnium oxides, hafnium silicates, titanium oxides, barium-strontium-titantates (BSTs) and lead-zirconate-titanates (PZTs).

As further shown in FIG. 4, a middle plate 170 is formed. The middle plate 170 can be formed by depositing a blanket layer of a middle plate material, and patterning the middle plate material. In one embodiment, the middle plate material includes TiN, although any suitable material can be used in accordance with the embodiments described herein. Any suitable patterning process can be used to pattern the middle plate 170 in accordance with the embodiments described herein.

Figure 5:
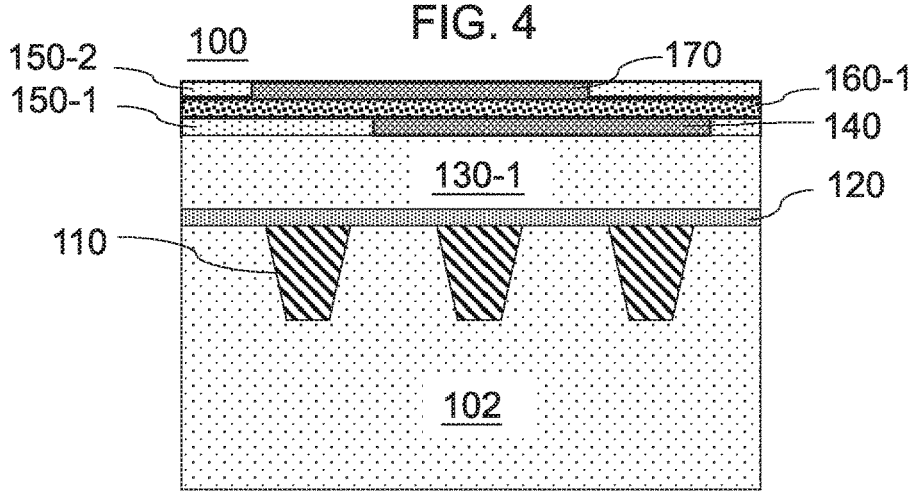
FIG. 5 is a cross-sectional view of a second etch tuning layer formed during the fabrication of the first semiconductor device, in accordance with an embodiment of the present invention.

Referring to FIG. 5, a second etch tuning layer 150-2 is formed on the device 100, and is planarized so that its surface is substantially co-linear with the surface of the middle plate 170. The second etch tuning layer 150-2 can include any suitable dielectric material having an etch rate similar to that of the middle plate 170. For example, the second etch tuning layer 150-2 can include a titanium oxynitride ($TiO_xN_y$), a tantalum oxide (e.g., $TaO_2$), etc. The second etch tuning layer 150-2 can be formed similar to the manner described above in FIG. 2 with respect to the etch tuning layer 150-1, and the planarization can be performed similar to the manner described above in FIG. 3.

Figure 6:
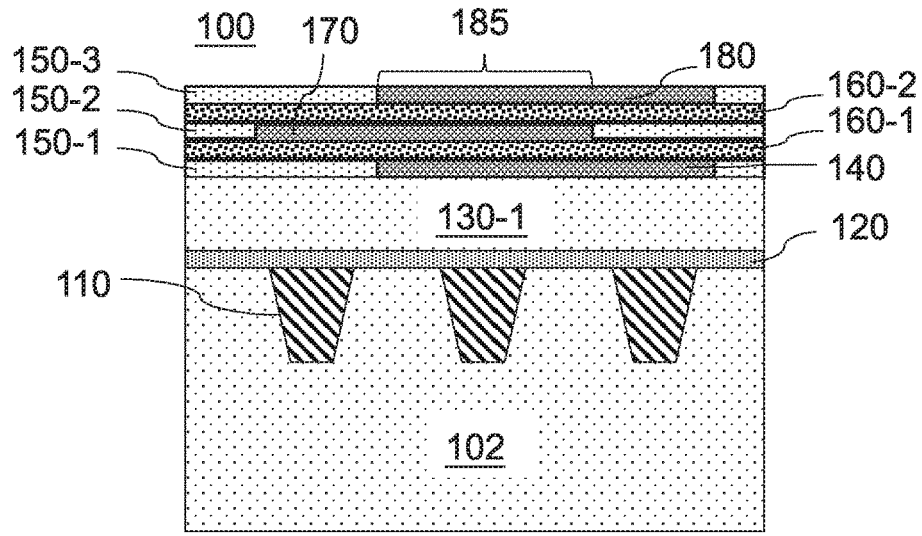
FIG. 6 is a cross-sectional view of a second dielectric layer, a top plate and a third etch tuning layer formed during the fabrication of the first semiconductor device, in accordance with an embodiment of the present invention.

Referring to FIG. 6, a second dielectric layer 160-2 is formed on the middle plate 170 and the etch tuning layer 150-2. The second dielectric layer 160-2 can include any suitable material in accordance with the embodiments described herein. In one embodiment, the second dielectric layer 160-2 includes a high-k dielectric material.

As further shown in FIG. 6, a top plate 180 is formed on the second dielectric layer 160-2. The top plate 180 can be formed by depositing a blanket layer of a top plate material, and patterning the top plate material. In one embodiment, the top plate material includes TiN, although any suitable material can be used in accordance with the embodiments described herein. Any suitable patterning process can be used to pattern the top plate 180 in accordance with the embodiments described herein.

As further shown in FIG. 6, a third etch tuning layer 150-3 is formed on the device 100, and the third etch tuning layer 150-3 is planarized so that its surface is substantially co-linear with the surface of the top plate 180. The third etch tuning layer 150-3 can include any suitable dielectric material having an etch rate similar to that of the top plate 180. For example, the etch tuning layer 150-3 can include a titanium oxynitride ($TiO_xN_y$), a tantalum oxide (e.g., $TaO_2$), etc. The third etch tuning layer 150-2 can be formed similar to the manner described above in FIGS. 2 and 5 with respect to the etch tuning layers 150-1 and 150-2, and the planarization can be performed similar to the manner described above in FIGS. 3 and 5.

Accordingly, a MIM region 185 including the bottom plate 140, the middle plate 170 and the top plate 180 is formed in FIG. 6. In one embodiment, each of the plates 140, 170 and 180 can have a thickness between about 30 nm to about 50 nm. In one embodiment, each of the dielectric layers 160-1 and 160-2 can have a thickness between about 3 nm to about 8 nm. More specifically, each of the dielectric layers 160-1 and 160-2 can have a thickness of about 5 nm.

The etch rates of the etch tuning layers and the plates should be similar. In one embodiment, each of the etch tuning layers 150-1 through 150-3 include the same material. In an alternative embodiment, at least one of the etch tuning layers 150-1 through 150-3 includes a different material. For example, the first etch tuning layer can include a material having (TiN) etch chemistry/etch rate for simultaneous etch, and the second and third etch tuning layers 150-2 and 150-3 can each include a material that can be etched selectively to the first etch tuning layer 150-1 and/or the plates 140, 170 and 180 (e.g., a material that can be etched selectively to TiN or a TiN like material). In one embodiment, at least one of the second and third etch tuning layers 150-2 and 150-3 includes an "easy etch layer." The term "easy etch layer," as used herein, refers to an etch layer that can be removed at a faster etch rate than the adjacent layer or under layer (e.g., 2-20 times faster). If the second etch tuning layer 150-2 and/or the third etch tuning layer 150-3 are "easy," this can enable one or more of the plates 140, 170 and 180 to be etched simultaneously.

Figure 7:
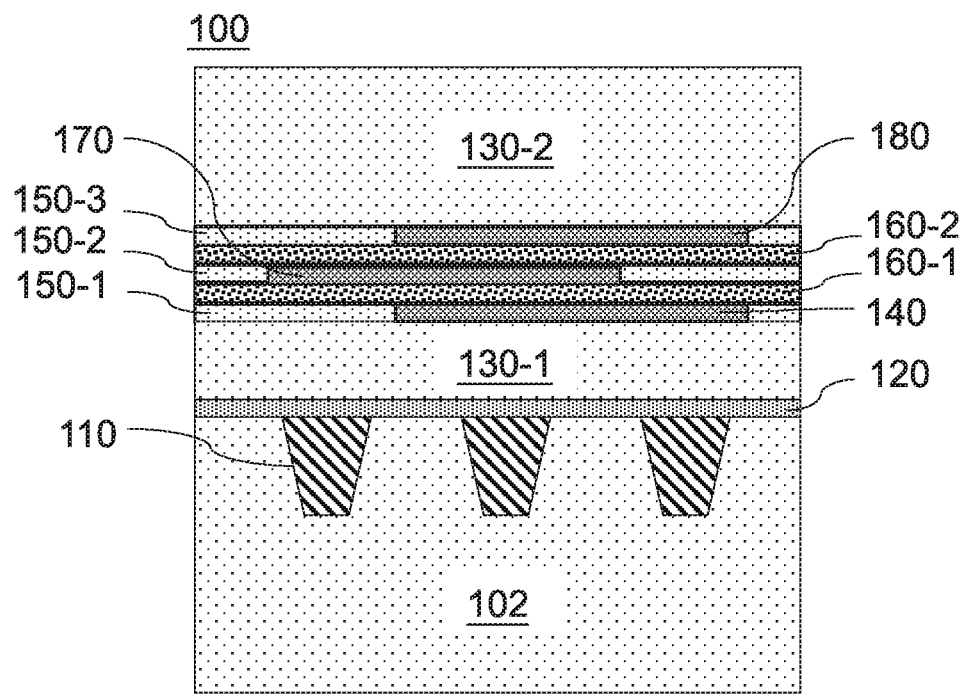
FIG. 7 is a cross-sectional view of an interlevel dielectric (ILD) layer formed during the fabrication of the first semiconductor device, in accordance with an embodiment of the present invention.

Referring to FIG. 7, a second ILD layer 130-2 is formed on the third etch tuning layer 150-3 and the top plate 180. The second ILD layer 130-2 can include any suitable material in accordance with the embodiments described herein. For example, the ILD layer 130-2 can include a low-k dielectric material, as described above in FIG. 1.

Figure 8:
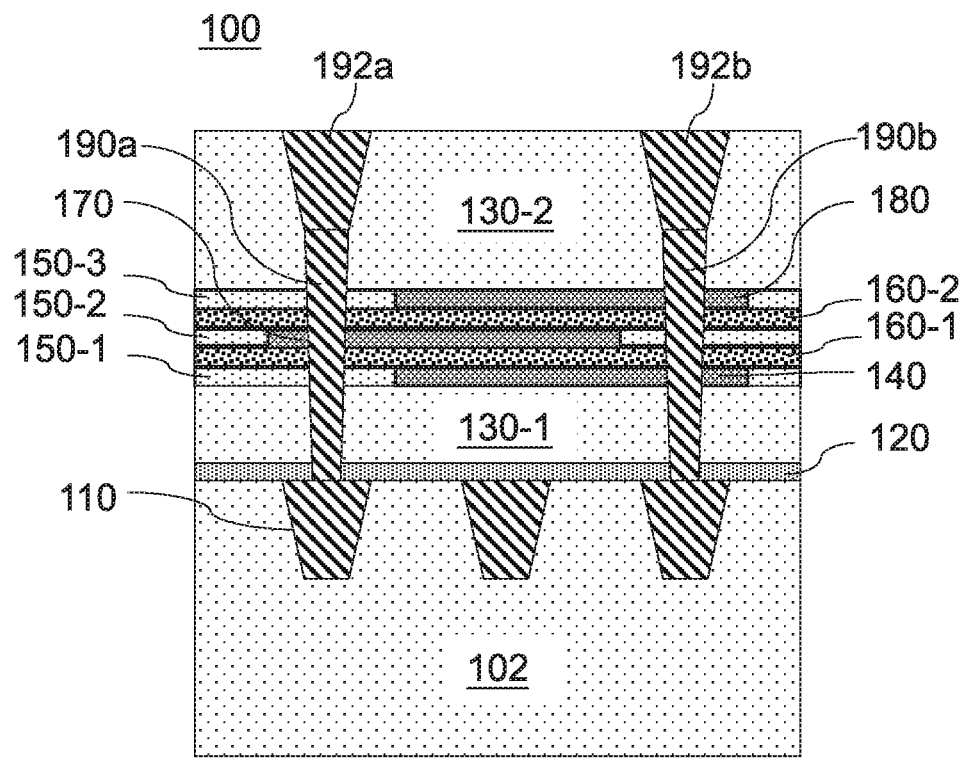
FIG. 8 is a cross-sectional view of the formation of a plurality of vias and contacts formed on respective ones of the vias during the fabrication of the first semiconductor device, in accordance with an embodiment of the present invention.

Referring to FIG. 8, a plurality of vias including vias 190a and 190b are formed through the device 100 onto respective ones of the contacts 110. As shown, the via 190a extends through etch tuning layers 150-1 and 150-3 and the middle plate 170, and the via 190b extends through etch tuning layer 150-2. The vias 190a and 190b can include any suitable material in accordance with the embodiments described herein. For example, in one embodiment, one or more of the vias 190a and 190b include Cu. Contacts 192a and 192b are respectively formed on the vias 190a and 190b. The contacts 192a and 192b can include any suitable material in accordance with the embodiment described herein. For example, in one embodiment, one or more of the contacts 192a and 192b include Cu.

Figure 9:
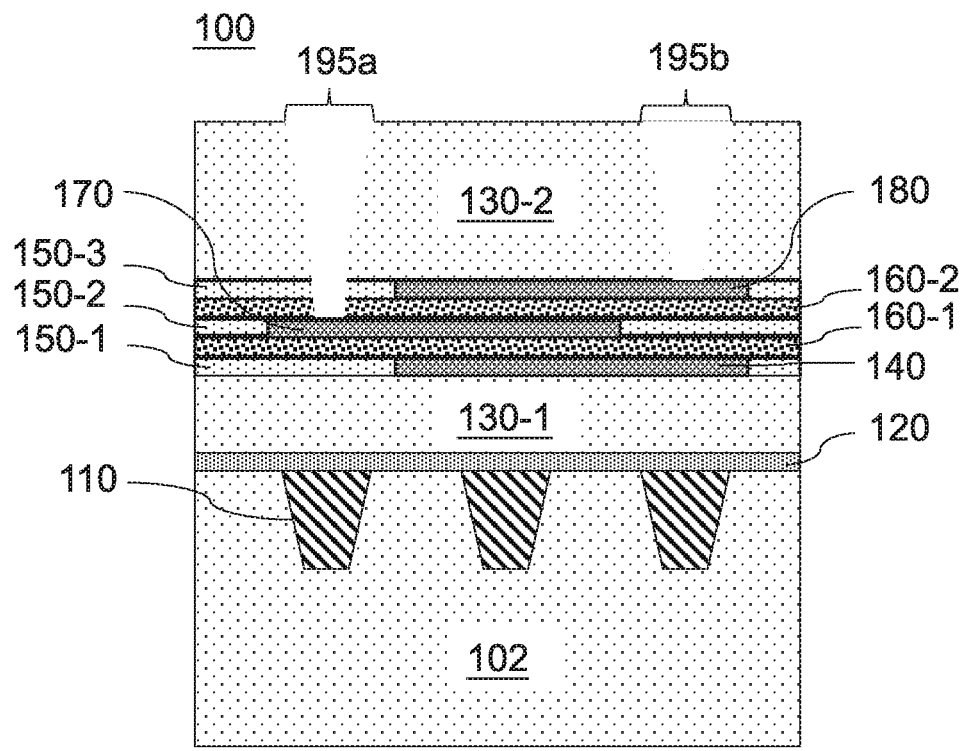
FIG. 9 is a cross-sectional view of a first etch process employed to form the vias of FIG. 8 during the fabrication of the first semiconductor device, in accordance with an embodiment of the present invention.
Figure 10:
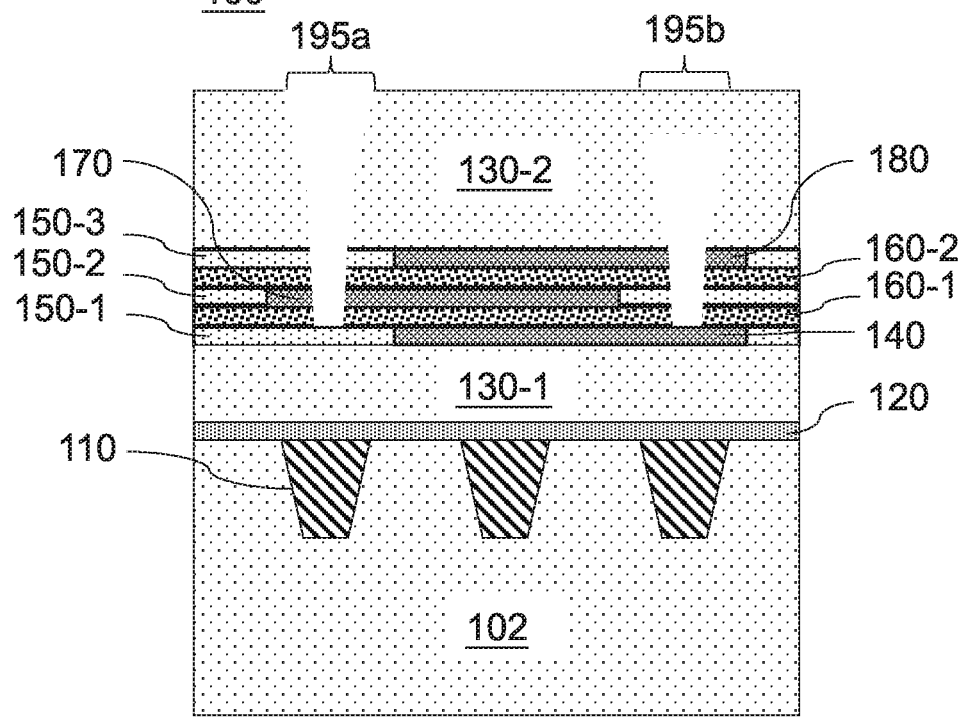
FIG. 10 is a cross-sectional view of a second etch process employed to form the vias of FIG. 8 during the fabrication of the first semiconductor device, in accordance with an embodiment of the present invention.
Figure 11:
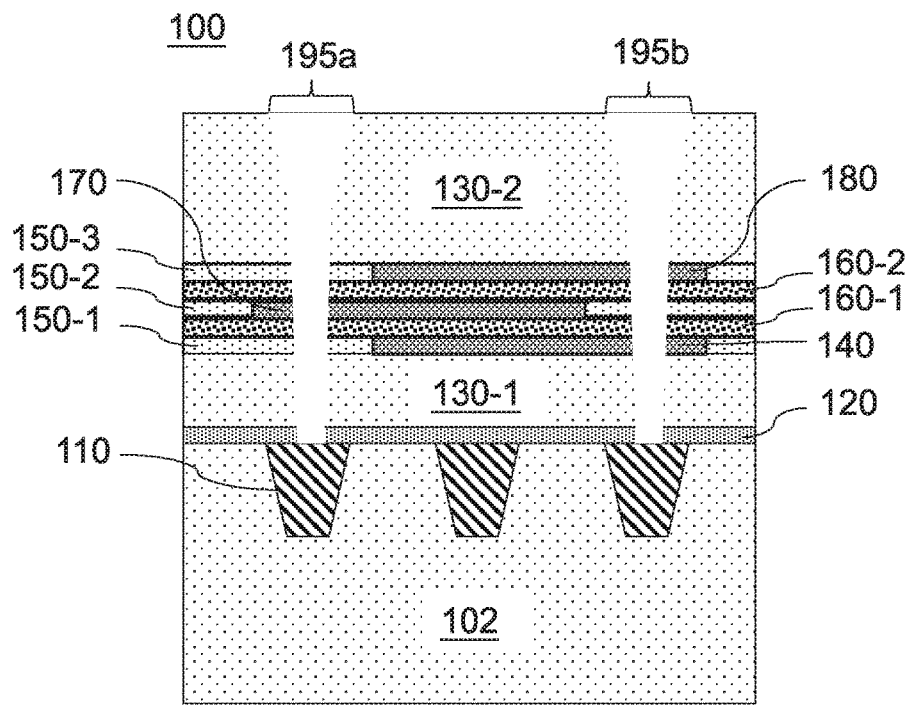
FIG. 11 is a cross-sectional view of a third etch process employed to form the vias of FIG. 8 during the fabrication of the first semiconductor device, in accordance with an embodiment of the present invention.

FIGS. 9-11 describe the etch processing performed to form the vias 190a and 190b and the contacts 192a and 192b, in accordance with an exemplary embodiment. Any suitable etch process can be used in accordance with the embodiments described herein. Although FIGS. 9-11 are shown during an illustrative dual damascene process, aspects of this illustrative embodiment can be applied to via formation during a single damascene process.

Referring to FIG. 9, regions 195a and 195b are initially formed. The region 195a includes a sub-region associated with the via 190a and another sub-region associated with the contact 192a. The region 195b includes a sub-region associated with the via 190b and another sub-region associated with the contact 192b. The region 195a is formed by etching to the middle plate 170, and the region 195b is formed by etching to the top plate 180.

In one embodiment, the third etch tuning layer 150-3 includes an easy etch layer, or a layer that includes a material that can be etched selective to the plate material (e.g., TiN). This enables the plates to be etched simultaneously. In one embodiment, portions of the dielectric layers 160-1 and 160-2 are eliminated during the plate etch (not shown).

Referring to FIG. 10, the region 195a is extended by etching to the etch tuning layer 150-1, and the region 195b is extended by etching to the bottom plate 140. In one embodiment, the second etch tuning layer 150-2 includes an easy etch layer, or a layer that includes a material that can be etched selective to the first etch tuning layer 150-1. The etch tuning layer 150-1 can have an etch chemistry/rate of the material of the plates for simultaneous etch.

Referring to FIG. 11, the regions 195a and 195b are extended to respective ones of the contacts 110. The region 195a can be filled with material to form the via 190a and the contact 192a, and the region 195b can be filled with material to form the via 190b and the contact 192b, as shown in FIG. 8. Accordingly, the etch depth of the vias can be balanced utilizing the etch tuning layers.

Figure 12:
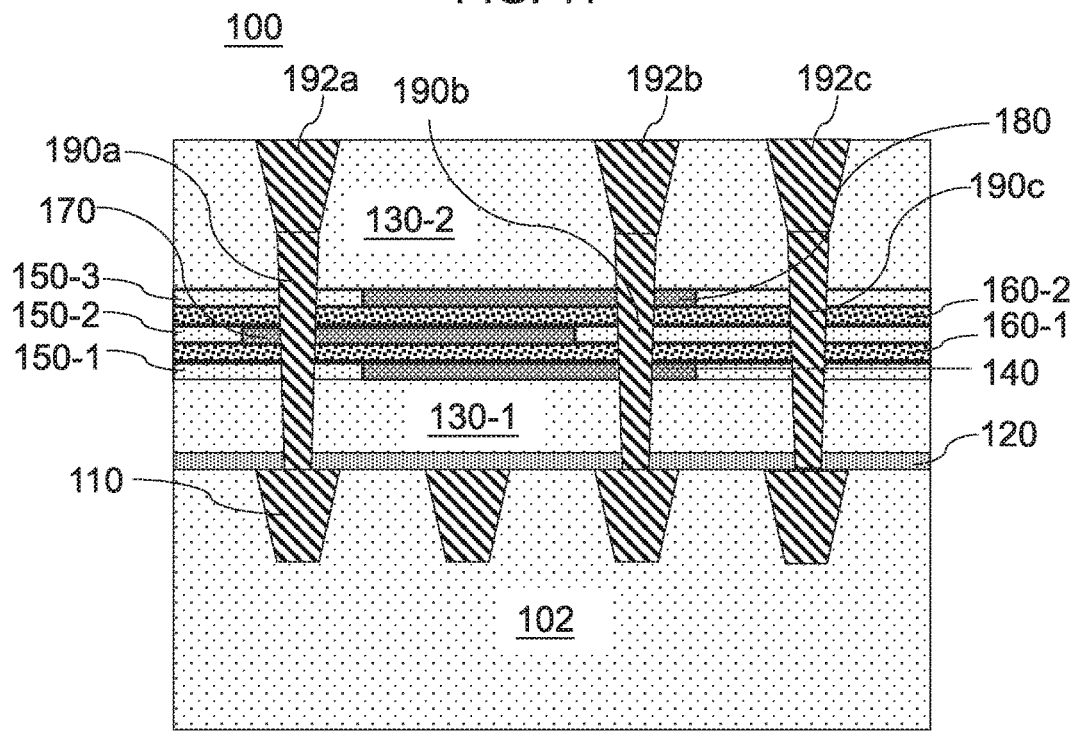
FIG. 12 is a cross-sectional view of the plurality of vias of the first semiconductor device, in accordance with an embodiment of the present invention.

Referring to FIG. 12, the view of the device 100 has been expanded in order to depict an additional via 190c formed through the device onto one of the contacts 110. As shown, the via 190c extends through etch tuning layers 150-1 through 150-3 and none of the plates. The via 190c can include any suitable material in accordance with the embodiments described herein. For example, in one embodiment, the via 190c includes Cu. A contact 192c is respectively formed on the via 190c, which can include any suitable material in accordance with the embodiment described herein. For example, in one embodiment, the contact 192c includes Cu.

In one embodiment, the via 190a is a power via and the via 190b is a ground via. In another embodiment, the via 190a is the ground via and the via 190b is the power via. Thus, the power and ground vias are interchangeable. The via 190c can be a signal via.

It is to be noted that at least a portion of a dielectric layer below a plate that is being etched may also get removed. For example, a portion of the dielectric layer 160-1 not covered by the middle plate 170 could get etched when etching the middle plate 170, which could result in that portion of the dielectric layer 160-1 being partially or completely removed.

FIGS. 13-24 depict respective steps of a process flow for fabricating a semiconductor device 200 including a metal-insulator-metal (MIM) capacitor structure, in accordance with an alternative embodiment that utilizes sacrificial layers.

Figure 13:
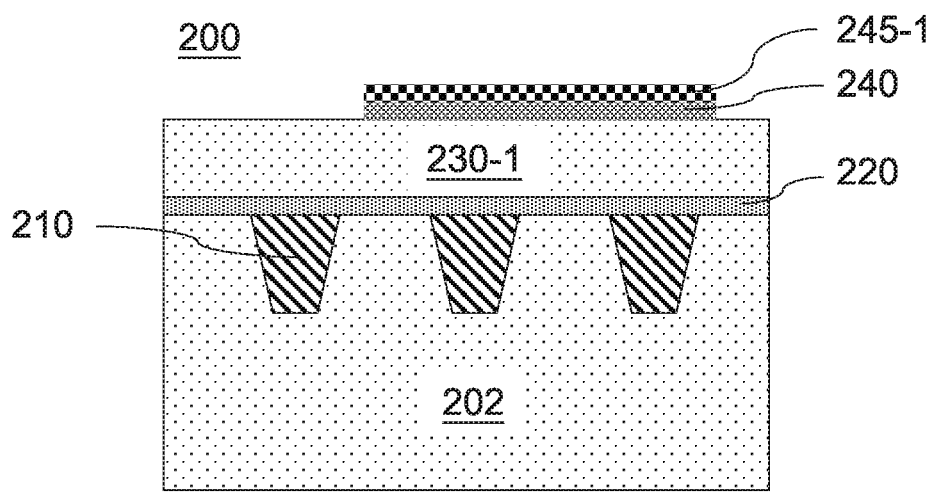
FIG. 13 is a cross-sectional view a bottom plate and a sacrificial layer formed during the fabrication of a second semiconductor device including a MIM capacitor structure, in accordance with an embodiment of the present invention.

Referring to FIG. 13, a cross-sectional view showing the formation of a bottom plate of a semiconductor device 200 is provided. As shown, the device 200 includes a base 202 having contacts 210 formed therein. The base 202 can include any suitable material in accordance with the embodiments described herein. For example, the base 202 can include a dielectric material. The contacts 210 can include any suitable material in accordance with the embodiment described herein. For example, in one embodiment, the contacts 210 include Cu.

The device 200 further includes a cap layer 220 formed on the base layer 202 and the contacts 210. The cap layer 220 can include any suitable material in accordance with the embodiments described herein. For example, the cap layer 220 can include a dielectric material.

The device 200 further includes an interlevel dielectric (ILD) layer 230-1. The ILD layer 230-1 can include any suitable material in accordance with the embodiments described herein. For example, the ILD layer 230-1 can include a low-dielectric material. A low-k dielectric material is a dielectric material having a dielectric constant (k) lower than the dielectric constant of silicon dioxide ($SiO_2$) at room temperature (e.g., 20° C.-25° C.) and atmospheric pressure (1 atm). Examples of low-k dielectric materials include, e.g., organosilicate glass (OSG), fluorine doped silicon dioxide, carbon doped silicon dioxide, poroussilicon dioxide, porous carbon doped silicon dioxide, spin-on organic polymeric dielectrics (e.g., SiLK™), spin-on silicone based polymeric dielectric (e.g., hydrogen silsesquioxane (HSQ) and methylsilsesquioxane (MSQ)), and combinations thereof.

The device 200 further includes bottom plate 240. The bottom plate 240 can be formed by depositing a blanket layer of bottom plate material, and patterning the bottom plate material. In one embodiment, the bottom plate material includes TiN, although any suitable material can be used in accordance with the embodiments described herein. Any suitable patterning process can be used to pattern the bottom plate 240 in accordance with the embodiments described herein.

In contrast to the device 100 described in FIGS. 1-8 above, the device 200 further includes a sacrificial layer 245-1 formed on the bottom layer 240. The sacrificial layer 245-1 acts as a protective layer. The sacrificial layer 245-1 can include any material suitable for use as a protective layer in accordance with the embodiments described herein. Furthermore, the sacrificial layer 245-1 can be formed using any suitable process in accordance with the embodiments described herein.

Figure 14:
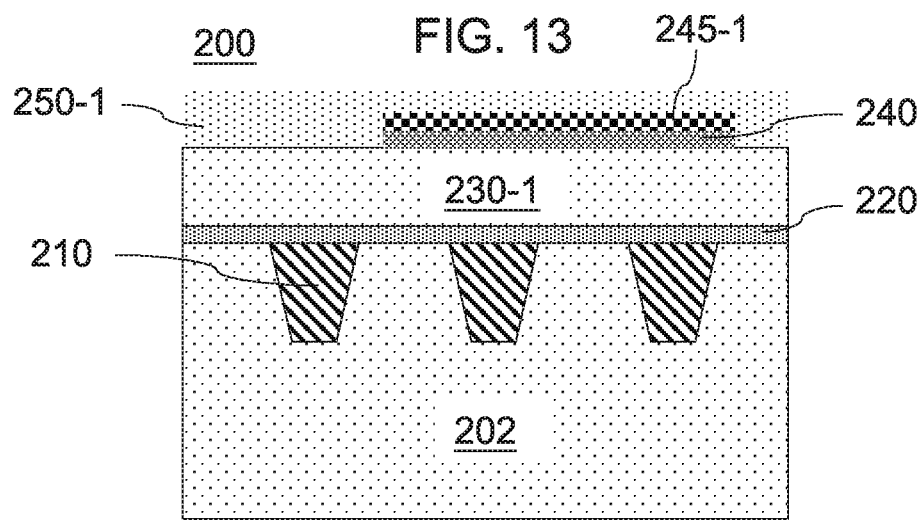
FIG. 14 is a cross-sectional view of layers of an etch tuning layer formed during the fabrication of the second semiconductor device, in accordance with an embodiment of the present invention.

Referring to FIG. 14, an etch tuning layer 250-1 is formed. The etch tuning layer 250-1 can include any suitable dielectric material having an etch rate similar to that of the bottom plate 240. For example, the etch tuning layer 250-1 can include a titanium oxynitride ($TiO_xN_y$), a tantalum oxide (e.g., $TaO_2$), etc. The etch tuning layer 250-1 can be formed using any suitable process in accordance with the embodiments described herein. For example, the etch tuning layer 250-1 can be formed by employing a CVD process. In one embodiment, the etch tuning layer 250-1 can be formed by employing a PE-CVD process. One example of a suitable PE-CVD process is a HDP-CVD process. For example, the dielectric material of the etch tuning layer 250-1 can include a material formed by employing a TEOS precursor (e.g., $SiO_2$).

Figure 15:
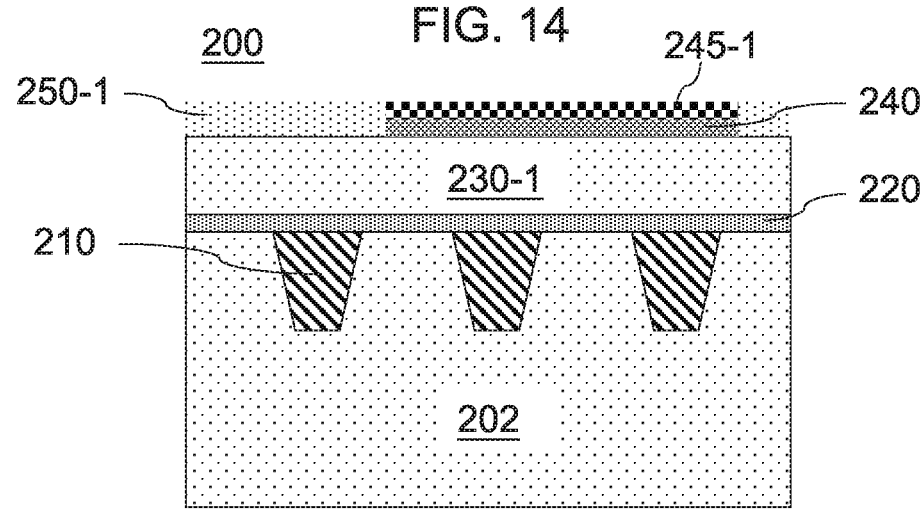
FIG. 15 is a cross-sectional view of planarization of the etch tuning layer during the fabrication of the second semiconductor device, in accordance with an embodiment of the present invention.

Referring to FIG. 15, the etch tuning layer 250-1 is planarized so that its surface is substantially co-linear with the surface of the sacrificial layer 245-1. In one embodiment, the etch tuning layer 250-1 is planarized by employing a CMP process. However, any suitable process for planarizing the etch tuning layer 250-1 can be used in accordance with the embodiments described herein.

Figure 16:
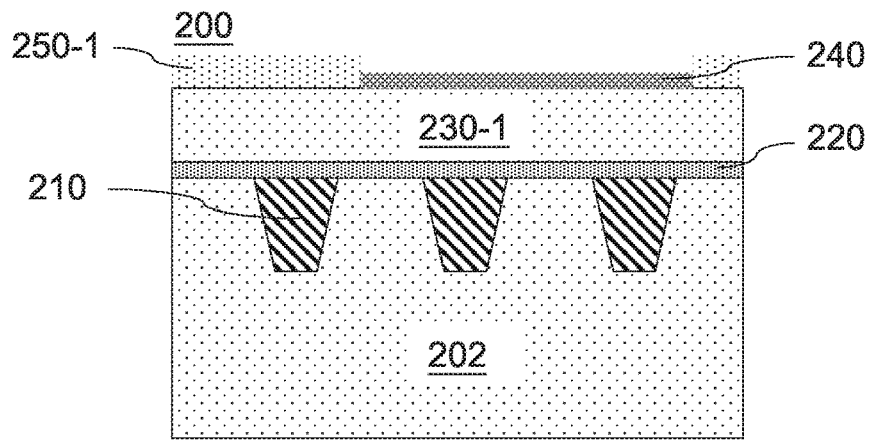
FIG. 16 is a cross-sectional view of the removal of the sacrificial layer during the fabrication of the second semiconductor device, in accordance with an embodiment of the present invention.

Referring to FIG. 16, the sacrificial layer 245-1 is removed (e.g., stripped). The sacrificial layer 245-1 can be removed utilizing any suitable process in accordance with the embodiments described herein.

Figure 17:
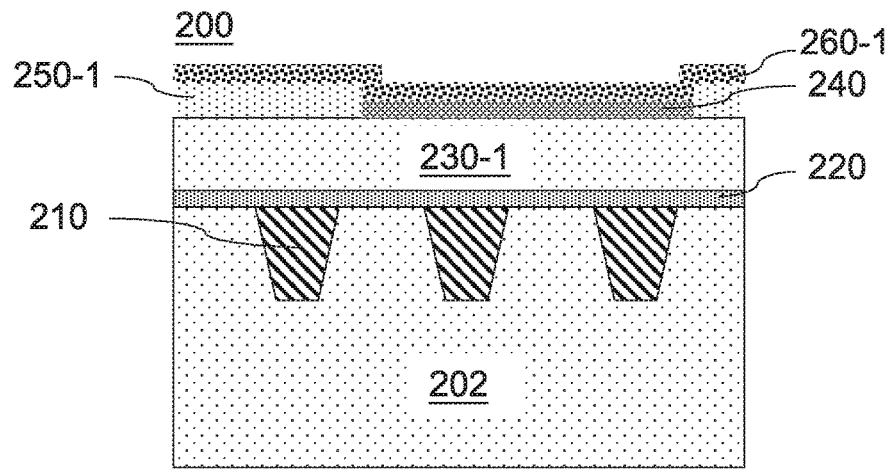
FIG. 17 is a cross-sectional view of a dielectric layer and an etch tuning layer formed during the fabrication of the second semiconductor device, in accordance with an embodiment of the present invention.

Referring to FIG. 17, a dielectric layer 260-1 is formed on the bottom plate 240 and the etch tuning layer 250-1. As shown, the dielectric layer 260-1 is conformally deposited along the bottom plate 240 and the etch tuning layer 250-1. The dielectric layer 260-1 can be deposited by any suitable thin film deposition method (e.g., plating, CVD or ALD), and can include any suitable material in accordance with the embodiments described herein. In one embodiment, the dielectric layer 260-1 includes a high-k dielectric material. A high-k dielectric material is a dielectric material having a dielectric constant (k) higher than the dielectric constant of silicon dioxide ($SiO_2$) at room temperature (e.g., 20° C.-25° C.) and atmospheric pressure (1 atm). Examples of high-k dielectric materials include, but are not limited to, hafnium oxides, hafnium silicates, titanium oxides, barium-strontium-titantates (BSTs) and lead-zirconate-titanates (PZTs).

Figure 18:
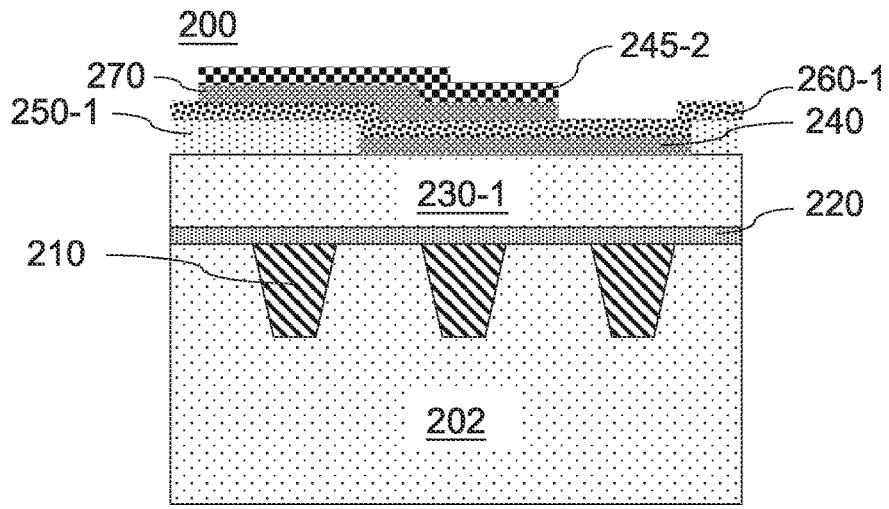
FIG. 18 is a cross-sectional view of a middle plate and a second sacrificial layer formed during the fabrication of the second semiconductor device, in accordance with an embodiment of the present invention.

Referring to FIG. 18, a middle plate 270 is formed on the dielectric layer 260-1. The middle plate 270 can be formed by depositing a blanket layer of a middle plate material, and patterning the middle plate material. As shown, the middle plate material is conformally deposited along the dielectric layer 260-1. The middle plate material can be deposited by any suitable thin film deposition method (e.g., plating, CVD or ALD). In one embodiment, the middle plate material includes TiN, although any suitable material can be used in accordance with the embodiments described herein. Any suitable patterning process can be used to pattern the middle plate 270 in accordance with the embodiments described herein.

As further shown in FIG. 18, a second sacrificial layer 245-2 is formed on the middle plate 270. As shown, the second sacrificial layer 245-2 is conformally deposited along the middle plate 270. The second sacrificial layer 245-2 and the middle plate 270 can be formed sequentially, and patterned simultaneously. The second sacrificial layer 245-2 can be deposited by any suitable thin film deposition method (e.g., plating, CVD or ALD). The second sacrificial layer 245-2 acts as a protective layer. The second sacrificial layer 245-2 can include any material suitable for use as a protective layer in accordance with the embodiments described herein.

Figure 19:
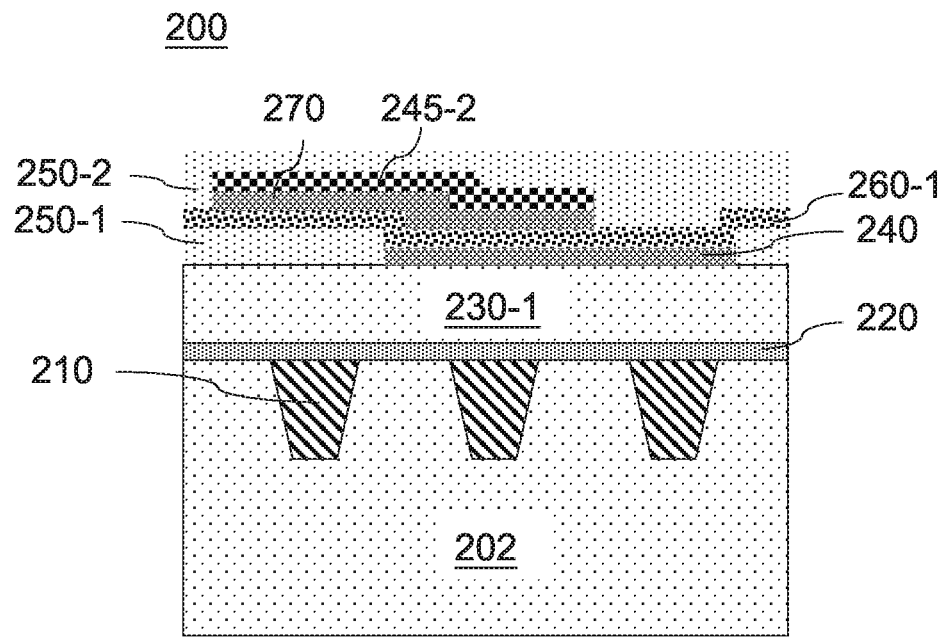
FIG. 19 is a cross-sectional view of a second etch tuning layer formed during the fabrication of the second semiconductor device, in accordance with an embodiment of the present invention.

Referring to FIG. 19, a second etch tuning layer 250-2 is formed on the device 200. The second etch tuning layer 250-2 can include any suitable dielectric material having an etch rate similar to that of the middle plate 270. For example, the second etch tuning layer 250-2 can include a titanium oxynitride ($TiO_xN_y$), a tantalum oxide (e.g., $TaO_2$), etc. The second etch tuning layer 250-2 can be formed similar to the manner described above in FIG. 10 with respect to the etch tuning layer 250-1.

Figure 20:
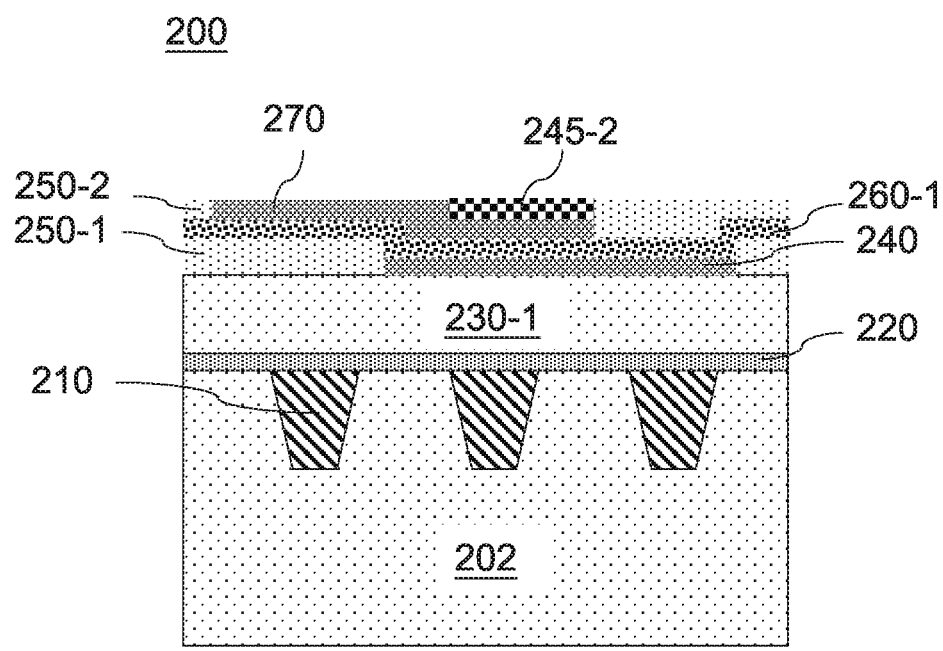
FIG. 20 is a cross-sectional view of planarization of the second etch tuning layer and the second sacrificial layer during the fabrication of the second semiconductor device, in accordance with an embodiment of the present invention.

Referring to FIG. 20, the second etch tuning layer 250-2 and the second sacrificial layer 245-2 are planarized so that their surfaces are substantially co-linear with the upper surface of the middle plate 270. The planarization can be performed similar to the manner described above in FIG. 13.

Figure 21:
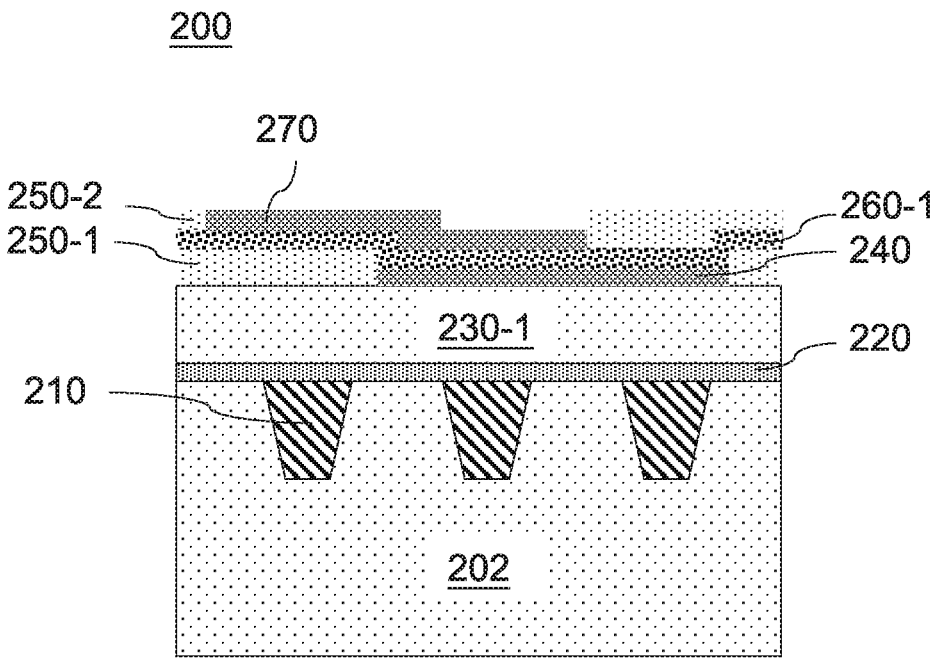
FIG. 21 is a cross-sectional view of the removal of the second sacrificial layer during the fabrication of the second semiconductor device, in accordance with an embodiment of the present invention.

Referring to FIG. 21, the second sacrificial layer 245-2 is removed (e.g., stripped). The second sacrificial layer 245-2 can be removed utilizing any suitable process in accordance with the embodiments described herein.

Figure 22:
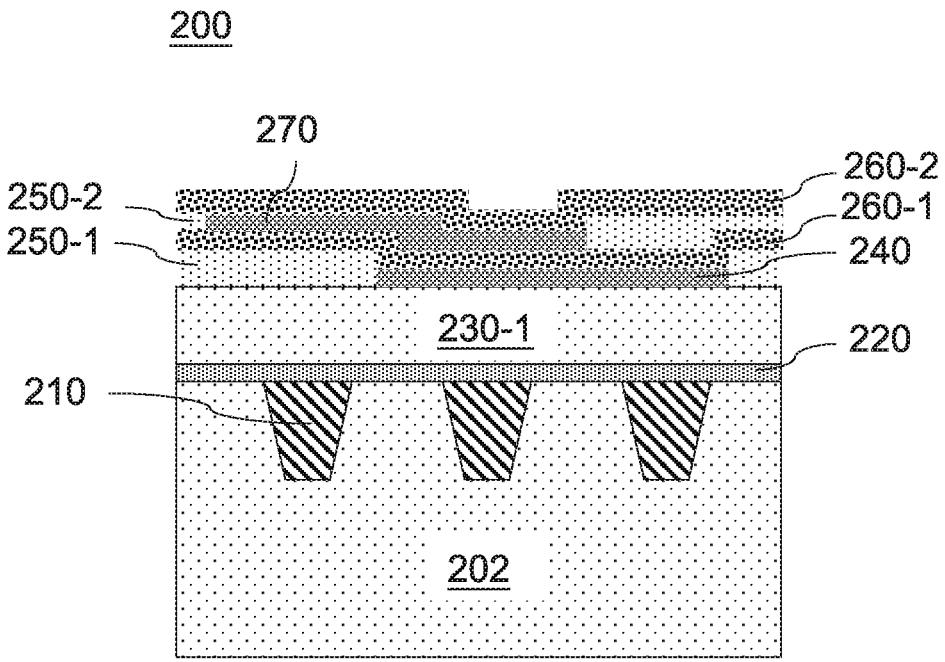
FIG. 22 is a cross-sectional view of a second dielectric layer formed during the fabrication of the second semiconductor device, in accordance with an embodiment of the present invention.

Referring to FIG. 22, a second dielectric layer 260-2 is formed on the middle plate 270 and the second etch tuning layer 250-2. As shown, the second dielectric layer 260-2 is conformally deposited along the middle plate 270 and the second etch tuning layer 250-2. The second dielectric layer 260-2 can be deposited by any suitable thin film deposition method (e.g., plating, CVD or ALD). The second dielectric layer 260-2 can include any suitable material in accordance with the embodiments described herein. In one embodiment, the second dielectric layer 260-2 includes a high-k dielectric material.

Figure 23:
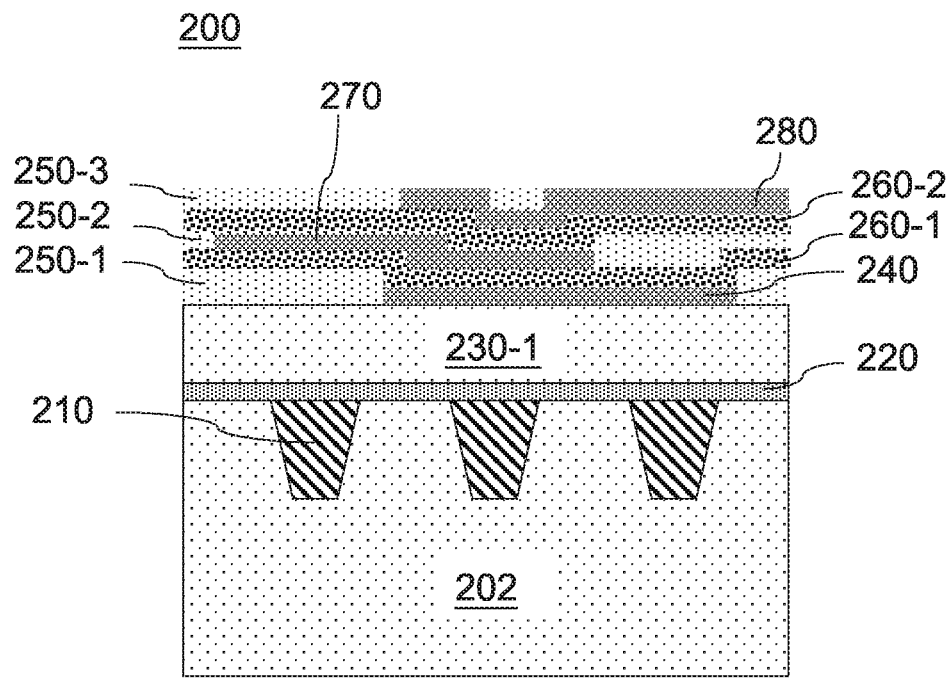
FIG. 23 is a cross-sectional view of a top plate and a third etch tuning layer formed during the fabrication of the second semiconductor device, in accordance with an embodiment of the present invention.

Referring to FIG. 23, a top plate 280 is formed on the second dielectric layer 260-2, and a third etch tuning layer 250-3 is formed on the second dielectric layer 260-2 and the top plate 280. As shown, the top plate 280 is conformally deposited along a portion of the second dielectric layer 260-2. The top plate 280 can be formed by depositing a blanket layer of a top plate material, and patterning the top plate material. In one embodiment, the top plate material includes TiN, although any suitable material can be used in accordance with the embodiments described herein. Any suitable patterning process can be used to pattern the top plate 280 in accordance with the embodiments described herein.

The top plate 280 is shown in this illustrative embodiment without a sacrificial layer formed thereon. However, in an alternative embodiment, a sacrificial layer can be formed on the top plate 280. For example, a sacrificial layer formed on the top plate 280 can be beneficial as a polish stop, similar to how the sacrificial layers 245-1 and 245-2 were used.

Accordingly, a MIM region 285 including the bottom plate 240, the middle plate 270 and the top plate 280 is formed in FIG. 23. In one embodiment, each of the plates 240, 270 and 280 can have a thickness between about 30 nm to about 50 nm. In one embodiment, each of the dielectric layers 260-1 and 260-2 can have a thickness between about 3 nm to about 8 nm. More specifically, each of the dielectric layers 260-1 and 260-2 can have a thickness of about 5 nm. In one embodiment, each of the sacrificial layers 245-1 and 245-2 can have a thickness between about 1 nm to about 10 nm. More specifically, each of the sacrificial layers 245-1 and 245-2 can have a thickness of about 3 nm.

Figure 24:
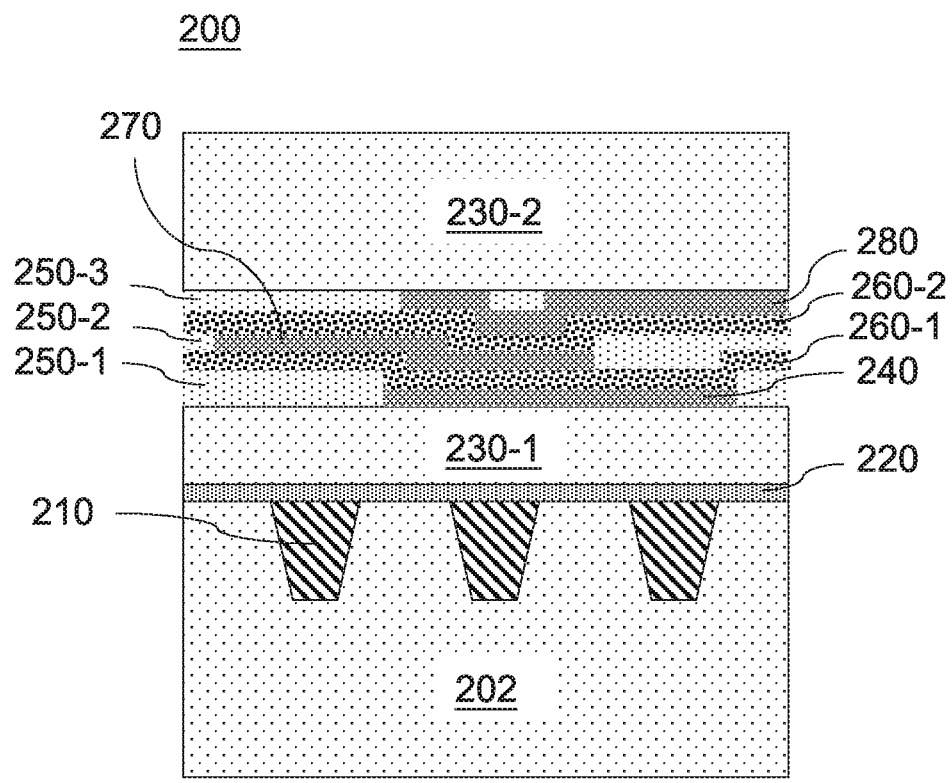
FIG. 24 is a cross-sectional view of an ILD layer formed during the fabrication of the second semiconductor device, in accordance with an embodiment of the present invention.

Referring to FIG. 24, a second ILD layer 230-2 is formed on the third etch tuning layer 250-3 and the top plate 280. The second ILD layer 230-2 can include any suitable material in accordance with the embodiments described herein. For example, the ILD layer 230-2 can include a low-dielectric material, as described above in FIG. 13.

Via processing can then be performed to form power, ground and signal vias through the device 100 onto respective ones of the contacts 210, and contacts on respective ones of the vias, similar to the via processing described above with reference to FIGS. 8-12.

Accordingly, the illustrative embodiments described herein provide for the formation of (dual damascene) lines/vias through layers of material that include TiN or have TiN-like etch rate/chemistry (e.g., with $F_2$ or $Cl_2$ etch chemistry).

Figure 25:
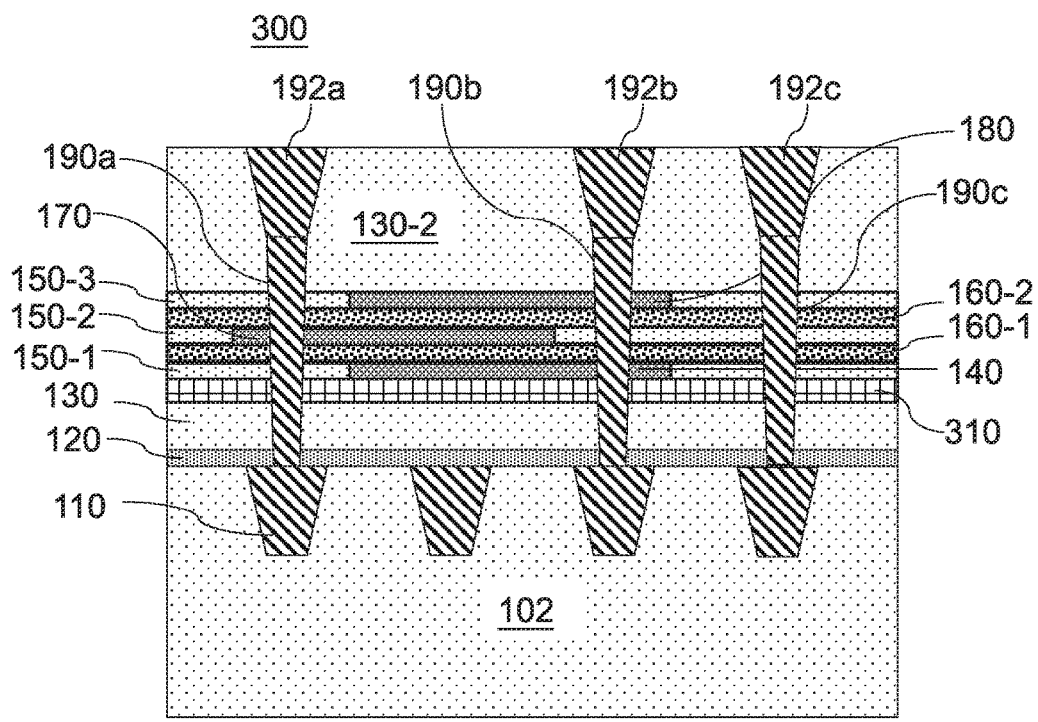
FIG. 25 is a cross-sectional view of a third semiconductor device including a MIM capacitor structure, in accordance with an embodiment of the present invention.

Referring to FIG. 25, a cross-sectional view showing a semiconductor device 300 including a MIM capacitor structure is provided. As shown, the device 300 is similar to the device 100 shown in FIG. 12, but includes an etch stop layer 310 inserted below the bottom plate 140. The etch stop layer 310 functions to balance etch depth of the vias before reaching the cap layer 120. The etch stop layer 310 can include any suitable dielectric material. For example, the etch stop layer 310 can include a titanium oxynitride (Ti- $O_xN_y$), a tantalum oxide (e.g., $TaO_2$), etc. The etch stop layer 310 can be formed using any suitable process in accordance with the embodiments described herein. For example, the etch stop layer 310 can be formed by employing a CVD process. In one embodiment, the etch stop layer 310 can be formed by employing a PE-CVD process. One example of a suitable PE-CVD process is a HDP-CVD process. For example, the dielectric material of the etch stop layer 310 can be a material formed by employing a TEOS precursor (e.g., $SiO_2$).

Although the device 300 shown in FIG. 25 includes the etch stop layers 150-1 through 150-3, in an alternative embodiment, the device 300 can be formed without one or more of the etch stop layers 150-1 through 150-3. The etch stop layer 310 can also be inserted during the fabrication of the device 200, with or without one or more of the etch stop layers 250-1 through 250-3.

Figure 26:
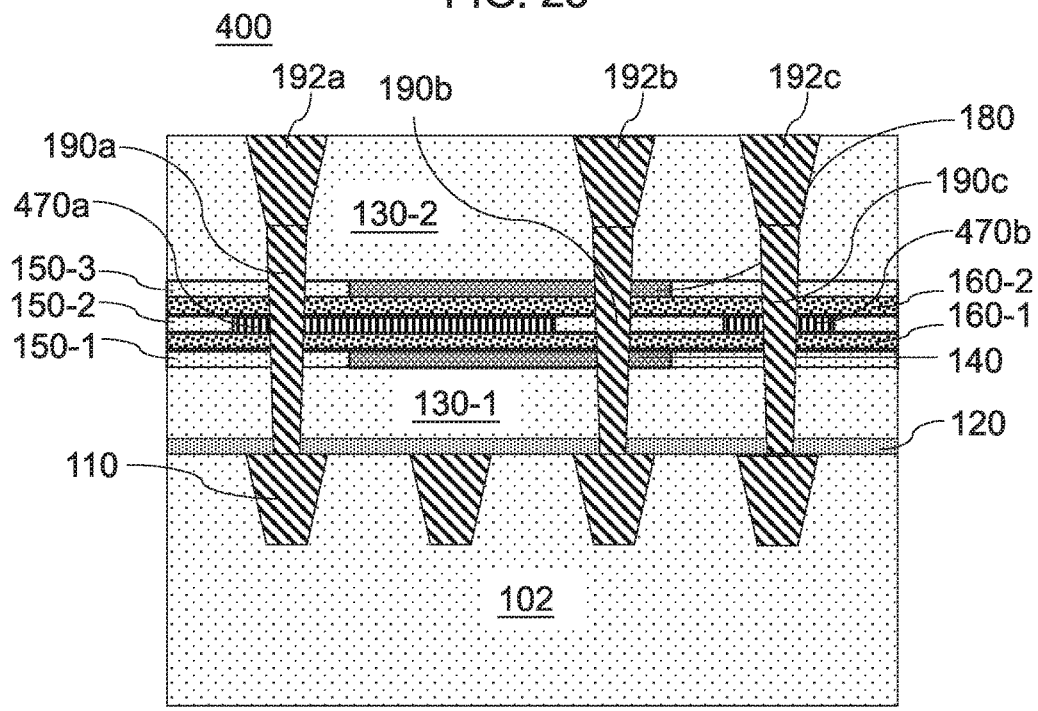
FIG. 26 is a cross-sectional view of a fourth semiconductor device including a MIM capacitor structure, in accordance with an embodiment of the present invention.

Referring to FIG. 26, a cross-sectional view showing a semiconductor device 400 is provided. As shown, the device 400 is similar to the device 100 shown in FIG. 12, but the middle plate 170 is replaced with a middle plate 470a that is penetrated by via 192a, and a middle plate 470b that is penetrated by via 192c.

The middle plate 470a can include a conductive hard mask layer embedded between the middle plate material (e.g., the surfaces of the middle plate 470a can include the middle plate material). In one embodiment, the middle plate material includes TiN, and the conductive hard mask layer includes titanium carbonitride (TiCN).

The middle plate 470b functions as a dummy plate for the via 190c (e.g., the signal via). The middle plate 470 can include the conductive hard mask layer embedded between the middle plate material, such as the middle plate 470a. Alternatively, the middle plate 470 can include at least two dummy plates (e.g., at least two dummy TiN plates).

The thickness of the middle plates 470a and/or 470b can be tuned to balance etch with or without the embedded conductive hard mask layer. Also, although the device 400 shown in FIG. 26 includes the etch stop layers 150-1 through 150-3, in an alternative embodiment, the device 400 can be formed without one or more of the etch stop layers 150-1 through 150-3. The middle plates 470a and 470b can also be used instead of the middle plate 270 during the fabrication of the device 200, with or without one or more of the etch stop layers 250-1 through 250-3.

The devices described herein above are examples of semiconductor devices each including a MIM capacitor structure having vias penetrating the MIM capacitor plates with sidewall contact. However, in alternative embodiments, the MIM capacitor structure can have vias landing on the MIM capacitor plates.

Having described preferred embodiments of a semiconductor device and a method of fabricating a semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for fabricating a semiconductor device, comprising:

forming a first plate of a metal-insulator-metal (MIM) capacitor structure and a first etch tuning layer adjacent to the first plate on a base structure, the base structure including contacts formed within a base layer;

forming a first dielectric layer on the first plate and the first etch tuning layer;

forming a second plate of the MIM capacitor structure and a second etch tuning layer adjacent to the second plate on the first dielectric layer;

forming a second dielectric layer on the second plate and the second etch tuning layer; and forming a third plate of the MIM capacitor structure and a third etch tuning layer adjacent to the third plate on the second dielectric layer, wherein the etch tuning layers include materials for balancing etch depth during formation of a plurality of vias.

2. The method of claim 1, wherein the base structure further includes a cap layer formed on the base layer and the contacts, and an interlevel dielectric (ILD) layer formed on the cap layer.

3. The method of claim 2, wherein the base structure further includes an etch stop layer formed on the ILD layer.

4. The method of claim 1, wherein the second plate includes a conductive hard mask layer embedded between middle plate material.

5. The method of claim 1, wherein a given one of the etch tuning layers includes a material selected from the group consisting of: a titanium oxynitride ($TiO_xN_y$), a titanium oxide, titanium carbonitride (TiCN), and a material formed by employing a tetraethyl orthosilicate (TEOS) precursor.

6. The method of claim 1, further comprising forming an interlevel dielectric layer (ILD) on the third plate and the third etch tuning layer.

7. The method of claim 6, further comprising forming the plurality of vias, including forming a first via to a first one of the contacts through the ILD layer, the first and third etch tuning layers and the second plate, and a second via to a second one of the contacts through the ILD layer, the second etch tuning layer and the first and third plates.

8. The method of claim 7, wherein one of the first and second vias is a power via and the other one of the first and second vias is a ground via.

9. The method of claim 7, wherein the plurality of vias further includes a third via formed to a third one of the contacts through the ILD layer and the first, second and third etch tuning layers, and wherein the third via is a signal via.

10. A method for fabricating a semiconductor device, comprising:

forming a first plate of a metal-insulator-metal (MIM) capacitor structure on a base structure, the base structure including contacts formed within a base layer;

forming a first sacrificial layer on the first plate;

forming a first etch tuning layer on the base structure adjacent to the first plate and the first sacrificial layer;

removing the first sacrificial layer, and forming a first dielectric layer on the first etch tuning layer and the first plate;

forming a second plate of the MIM capacitor structure on the first dielectric layer, and a second sacrificial layer on the second plate;

forming a second etch tuning layer on the second sacrificial layer and the first dielectric layer, and planarizing such that the second etch tuning layer has a surface co-linear with surfaces of the second plate and the second sacrificial layer;

removing the second sacrificial layer, and forming a second dielectric layer on the second etch tuning layer and the second plate; and forming a third plate of the MIM capacitor structure and a third etch tuning layer adjacent to the third plate on the third dielectric layer, wherein the etch tuning layers include materials for balancing etch depth during formation of a plurality of vias.

11. The method of claim 10, wherein the base structure further includes a cap layer formed on the base layer and the contacts, and an interlevel dielectric (ILD) layer formed on the cap layer.

12. The method of claim 11, wherein the base structure further includes an etch stop layer formed on the ILD layer.

13. The method of claim 10, wherein the second plate includes a conductive hard mask layer embedded between middle plate material.

14. The method of claim 10, wherein a given one of the etch stop layers includes a material selected from the group consisting of: a titanium oxynitride ($TiO_xN_y$), a titanium oxide, titanium carbonitride (TiCN), and a material formed by employing a tetraethyl orthosilicate (TEOS) precursor.

15. The method of claim 10, further comprising forming an interlevel dielectric layer (ILD) on the third plate and the third etch tuning layer.

16. The method of claim 15, further comprising forming the plurality of vias, including forming a first via to a first one of the contacts through the ILD layer, the first and third etch tuning layers and the second plate, and a second via to a second one of the contacts through the ILD layer, the second etch tuning layer and the first and third plates.

17. The method of claim 16, wherein one of the first and second vias is a power via and the other one of the first and second vias is a ground via.

18. The method of claim 16, wherein the plurality of vias further includes a third via formed to a third one of the contacts through the ILD layer and the first, second and third etch tuning layers, and wherein the third via is a signal via.

\* \* \* \* \*